United States Patent [19]

Narushima et al.

[11] Patent Number: 5,065,495
[45] Date of Patent: Nov. 19, 1991

[54] METHOD FOR HOLDING A PLATE-LIKE MEMBER

[75] Inventors: Masaki Narushima; Itaru Takao, both of Yamanashi, Japan

[73] Assignee: Tokyo Electron Limited, Tokyo, Japan

[21] Appl. No.: 534,258

[22] Filed: Jun. 8, 1990

Related U.S. Application Data

[62] Division of Ser. No. 281,224, Dec. 8, 1988, Pat. No. 4,955,590.

[30] Foreign Application Priority Data

Jun. 10, 1987 [JP] Japan .................... 62-144926

[51] Int. Cl.[5] .............................. B25B 11/00
[52] U.S. Cl. ........................ 29/559; 269/21
[58] Field of Search ........... 414/627, 673, 752, 222, 414/225, 589, 590; 294/64 R; 269/21, 20, 903, 13, 14, 296; 29/559

[56] References Cited

U.S. PATENT DOCUMENTS

| 4,530,635 | 7/1985 | Engelbrecht et al. | 269/21 |
| 4,535,834 | 8/1985 | Turner | 269/21 |
| 4,684,113 | 8/1987 | Douglas et al. | 269/21 |
| 4,700,488 | 10/1987 | Curti | 269/21 |

FOREIGN PATENT DOCUMENTS

| 63-6738 | 1/1988 | Japan . |
| 63-128711 | 6/1988 | Japan . |
| 63-172438 | 7/1988 | Japan . |

Primary Examiner—Robert C. Watson
Attorney, Agent, or Firm—Oblon, Spivak, McClelland, Maier & Neustadt

[57] ABSTRACT

A semiconductor wafer receiving apparatus has a base, a table for supporting a wafer, a receiving member having at least three receiving pins which project from a supporting surface and are concealed under the supporting surface upon vertical movement of the table, and a driving unit for vertically moving the table. The wafer is transferred onto the receiving pins while the receiving pins project, and is held on the table while the receiving pins are concealed.

2 Claims, 4 Drawing Sheets

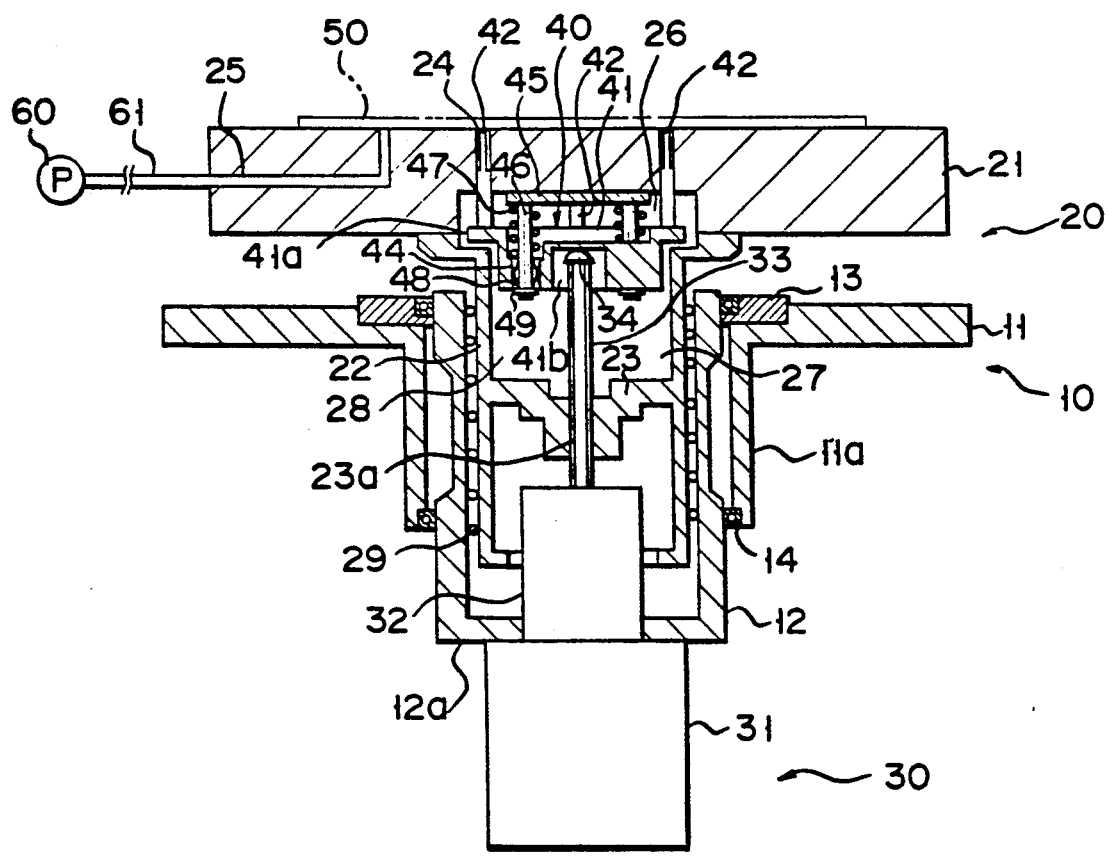
F I G. 1

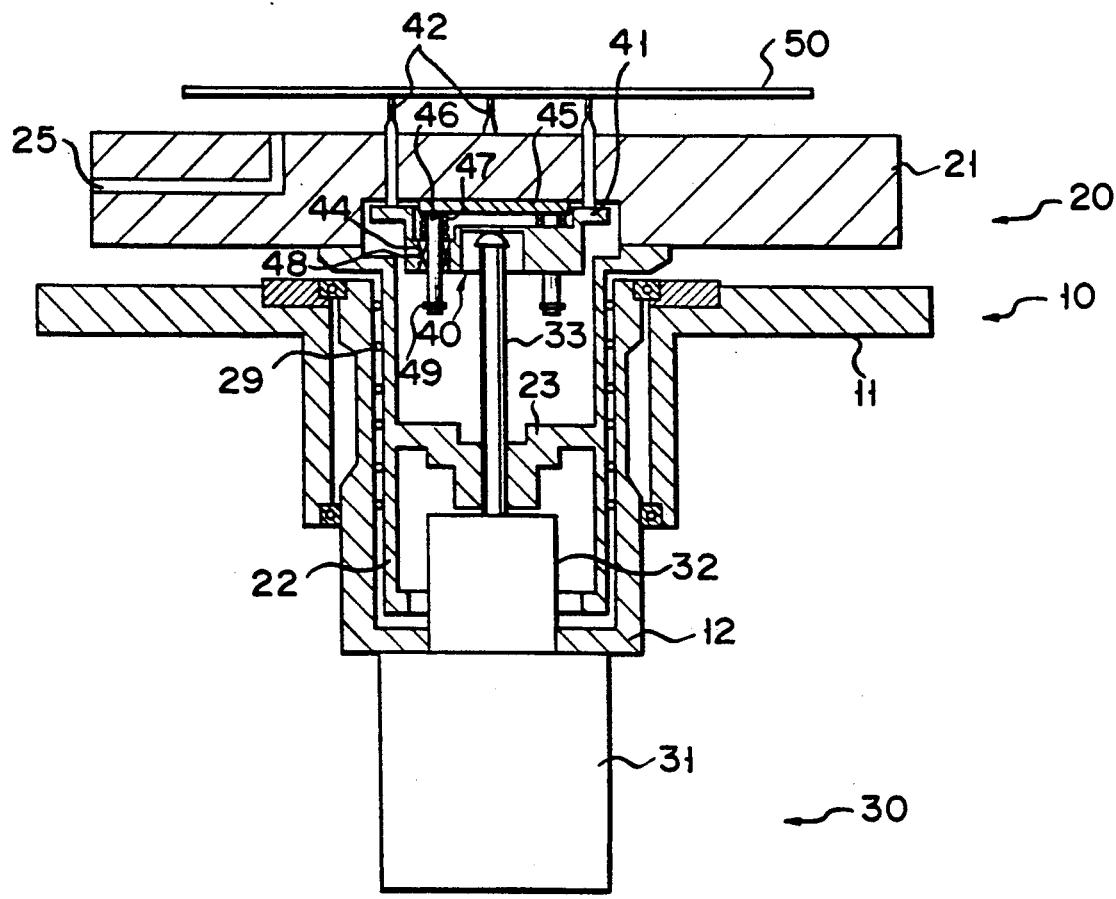
F I G. 2

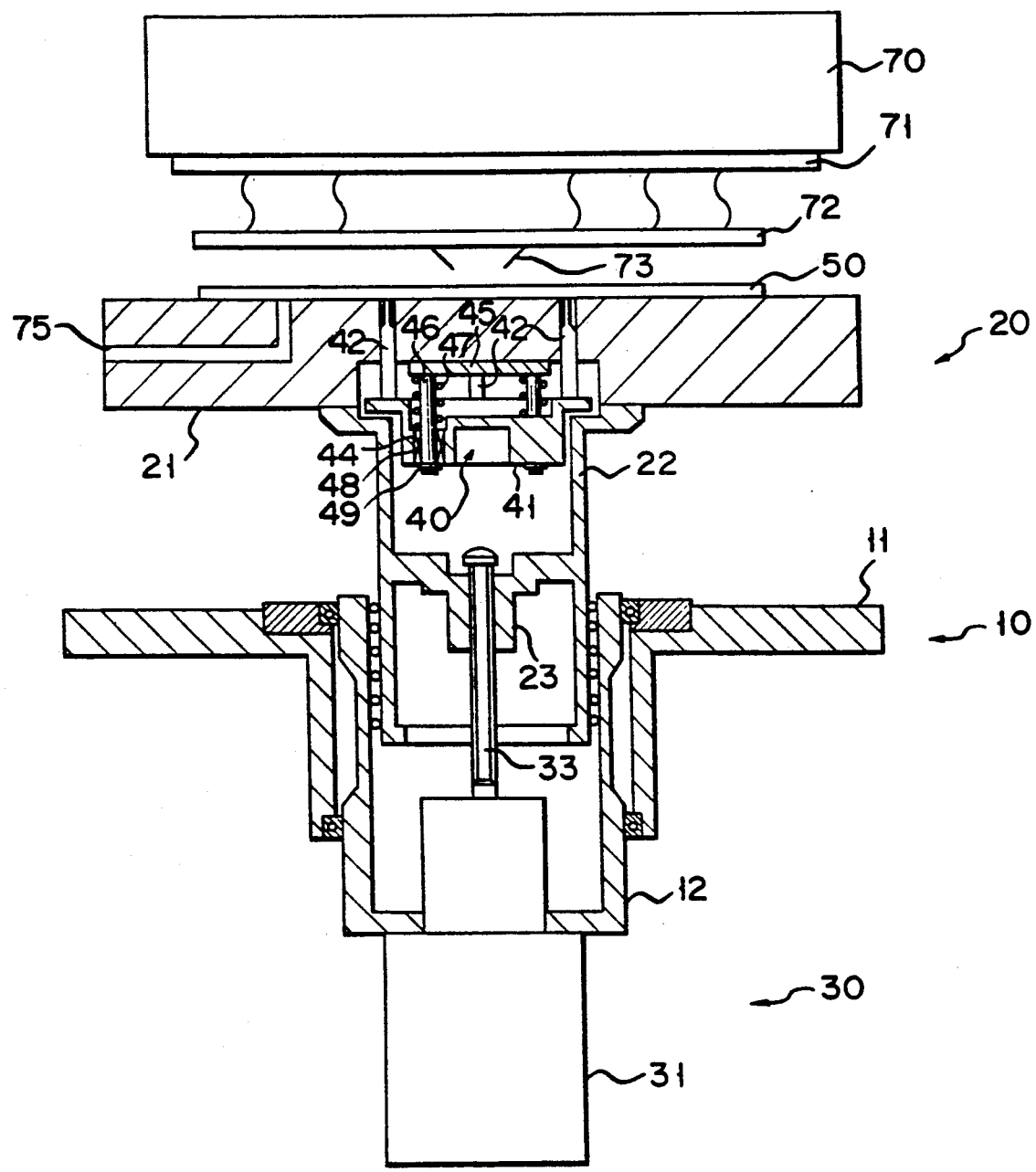
F I G. 3

METHOD FOR HOLDING A PLATE-LIKE MEMBER

This is a division of application Ser. No. 07/281,224, filed on Dec. 8, 1988 now U.S. Pat. No. 4,955,590.

BACKGROUND OF THE INVENTION

1. Field of the Invention

The present invention relates to a holding apparatus for holding a plate-like member such as a semiconductor wafer, and a method for holding the member.

2. Description of the Related Art

In the step of machining or inspecting a semiconductor in the process of the manufacture of a semiconductor, e.g., in the step of measuring electrical characteristics of a wafer using a wafer prober, a semiconductor wafer conveyed by a conveyor belt or a robot arm from a wafer carrier is placed on a convey arm after performed prealignment by way of positioning a flat orientation, and is transferred from the convey arm to a chuck for supporting the semiconductor wafer while chucking it.

In the wafer transfer step, a plurality of pins of projecting members embedded in the chuck project from the surface of a holding table of the chuck, and the semiconductor wafer is transferred onto the projecting pins from the convey arm. The projecting members are moved downward and the pins are concealed in the chuck, and then the wafer placed on the pins are chucked and fixed on the upper surface of the holding table. In this state, the chuck is intermittently moved for each wafer so that a large number of probes supported to a probe card correspond to a large number of electrodes on each chip of the wafer.

Such a holding apparatus is disclosed in, for example, Japanese Utility Model Publication No. 62—6691.

However, in the conventional holding apparatus, a semiconductor wafer as a plate-like member is transferred onto the plurality of pins projecting from the holding table, and thereafter, the pins are moved downward. Therefore, the speed of downward movement of the pins and that of the semiconductor wafer which receives an air resistance differ from each other, with the result that the wafer floats. In this case, the semiconductor wafer performed prealignment is placed on an offset position on the holding table, and in the worst case, may be dropped from the holding table.

When the wafer is transferred from the convey arm to the pins of the projecting members, noise is generated as the distal ends of the pins, which are being moved upward, collide against the wafer.

SUMMARY OF THE INVENTION

The present invention has been developed to solve the above problems, and has as its object to provide a plate-like member holding apparatus which can hold a plate-like member in a predetermined position, without making too much noise.

A plate-like member receiving apparatus according to the present invention comprises: a base unit; a table member having a supporting surface on which a plate-like member is supported, and which is vertically movable with respect to the base unit; a receiving member having at least three receiving pins which project from the supporting surface and are concealed under the holding surface upon vertical movement of the table member, movement of the receiving member relative to the base unit being eliminated when the plate-like member is supported on the table member; and drive means for vertically moving the table member, wherein the plate-like member is transferred onto the receiving pins while the receiving pins project, and is supported on the supporting surface of the table member while the pins are concealed.

BRIEF DESCRIPTION OF THE DRAWINGS

FIG. 1 is a sectional view showing a receiving apparatus according to an embodiment of the present invention;

FIG. 2 is a sectional view showing a state wherein the apparatus shown in FIG. 1 receives a semiconductor wafer;

FIG. 3 is a sectional view showing a state wherein, when the apparatus shown in FIG. 1 is applied to a wafer probing machine, electrode pads of a semiconductor wafer are brought into contact with probes;

DESCRIPTION OF THE PREFERRED EMBODIMENT

Figure 4:
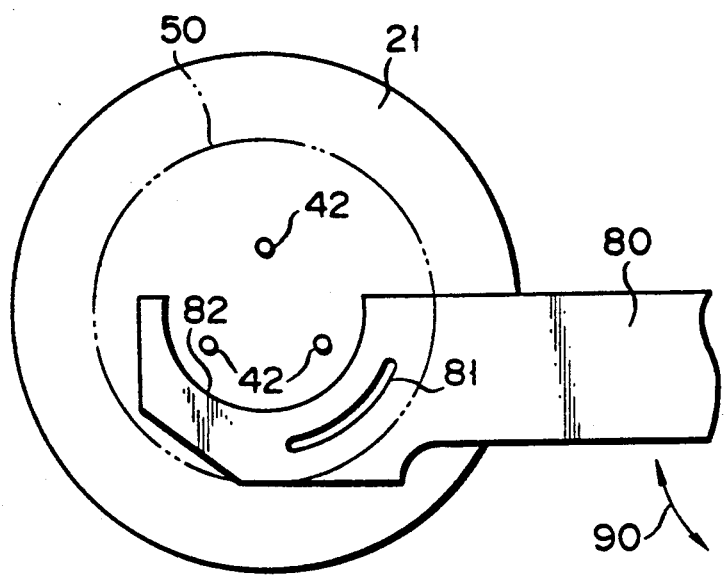
FIG. 4 is a plan view showing a state wherein a semiconductor wafer is transferred from a convey arm onto pins.

An embodiment of the present invention will now be described with reference to the accompanying drawings. FIG. 1 is a sectional view showing a plate-like member received apparatus according to an embodiment of the present invention. The receiving apparatus comprises base unit 10, table unit 20 which is vertically movably arranged on base unit 10, driving unit 30 for vertically moving table unit 20, and projecting member 40 for receiving a semiconductor wafer while projecting from table unit 20.

Base unit 10 has base 11 having cylindrical projecting portion 114 projecting downward, and outer cylinder 12 fixed to projecting portion 11a by mounting members 13 and 14.

Table unit 20 has disk-like table 21 on which, semiconductor wafer 50 as a plate-like member, is held, and cylindrical member 22 which is coaxially fixed to the lower surface of table 21 so that its longitudinal direction coincides with the vertical direction.

Recess 26 capable of receiving main body of projecting member 40 (to be described later) is formed in the central portion of the lower surface of table 21, and at least three (only two shown in FIG. 1 but three in this embodiment) through holes 24 through which pins 42 (to be described later) of projecting member 40 are inserted are formed contiguous with recess 26 to be perpendicular to the placing surface. Vacuum suction hole 25 having an L-shaped section extends from the upper surface to the side surface of placing table 21. Hole 25 is coupled to vacuum pump 60 through pipe 61. When pump 61 is operated, wafer 50 is chucked on the holding surface (upper surface) of table 21.

Cylindrical member 22 is arranged to be vertically movable along the inner wall of outer cylinder 12 of base unit 10. Cylindrical member 22 has disk-like nut portion 23 having screw hole 23a at the center of the inner central portion. Bearing (also called ball bearing) 29 is arranged between cylindrical member 22 and outer cylinder 12 so that cylindrical member 22 can be easily vertically moved along outer cylinder 12.

Driving unit 30 comprises motor 31, coupling 32, and ball screw 33 extending upward from coupling 32, and driven by motor 31. Ball screw 33 is threadably engaged with screw hole 23a of nut portion 23, and when ball screw 33 is rotated by motor 31, placing unit 20 is vertically moved. Semi-spherical distal end portion 34 is formed at the distal end of ball screw 33.

Projecting member 40 is vertically movably arranged on the inner upper end portion of cylindrical member 22. Projecting member 40 has main body 41, and at least three (three this embodiment) pins 42 which are inserted in holes 24 when they project upward from main body 41, so as to support wafer 50. Collar portion 41a is formed along the outer periphery of main body 41, and recess portion 41b is formed in the central portion of the lower surface of main body 41. When wafer 50 is received and placed on table 21, distal end portion 34 of ball screw 33 of driving unit 30 abuts against recess portion 41b. Main body 41 is substantially accommodated in recess 26 when table 21 is moved downward and pins 42 project from the upper surface of table 21 upon transfer of wafer 50. More specifically, upon transfer of wafer 50, movement of projecting member 40 is inhibited by distal end portion 34 of ball screw 33, and only table 21 is moved. Note that the distal end portion of each pin 42 is slightly tapered and rounded.

Mounting plate 45 is fixed to a portion, corresponding to recess 26, of the lower surface of table 21 by, e.g., screws. Three guide shafts 46 (only two of them shown in FIG. 1) extending downward are attached to mounting plate 45. Holes 44 for receiving guide shafts 46 through bearings 48 are formed in the main body of projecting member 40. The projecting member 40 can be smoothly moved without being displaced by these guide shafts 46 and bearings 48. Spring 47 fixed to mounting plate 45 and corresponding bearing 48 is arranged around each guide shaft 46. Projecting member 40 is biased downward by springs 47. E ring 49 serving as a stopper is provided near the lower end of each shaft 46.

Since guide shafts 46 and bearings 48 are arranged in this manner, a rotational moment from ball screw 33 can be absorbed. Since pins 42 can be prevented from being rubbed against portions of holes 24 of table 21, generation of dust can be prevented.

Note that cylindrical member 22 can be rotated along the inner wall of outer cylinder 12 by a driver (not shown), thus allowing alignment of the semiconductor wafer on placing table 21.

The operation of the apparatus with the above arrangement will be described below.

Figure 5:
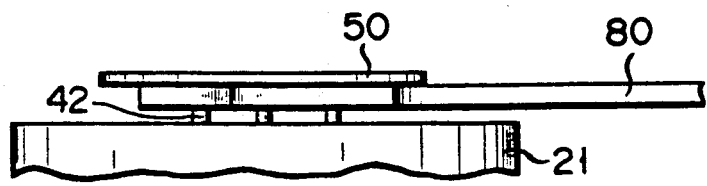
FIG. 5 is a side view of FIG. 4.

As shown in FIGS. 4 and 5, the holding apparatus of this embodiment is placed immediately below plate-like convey arm 80 which conveys wafer 50 to chuck it at suction hole 81 by a vacuum pump (not shown). Arm 80 has notch 82 for escaping from pins 42 when pins 42 project. Motor 31 is driven to move table unit 20 downward. In this case, since distal end portion 34 of ball screw 33 abuts against recess portion 41b of projecting member 40, projecting member 40 is left in position, and only table unit 20 is moved downward. As a result, as shown in FIG. 2, pins 42 of projecting member 40 project from the upper surface of placing table 21. In this state, a plane is defined by three pins 42, semiconductor wafer 50 is transferred from convey arm 80 onto pins 42, and wafer 50 is then supported on pins 42, as shown in FIG. 5. The projecting height of each pin 42 is large enough to allow insertion and escaping of arm 80 upon transfer of wafer 50. During transfer of wafer 50, arm 80 loading wafer 50 is located immediately above table 21, and after transfer, arm 80 is escaped in a direction of arrow 90 in FIG. 4.

Motor 31 is then driven to move holding unit 20 upward. In this case, projecting member 40 is kept supported on ball screw 33, and only table unit 20 is moved upward. Therefore, pins 42 of projecting member 40 are concealed in holes 24 of table 21, and hence, wafer 50 is placed on the upper surface of table 21. Then, vacuum pump 60 is operated, so that wafer 50 is chucked on the upper surface of table 21.

After predetermined inspection or machining is performed while semiconductor wafer 50 is chucked on table 21, the semiconductor wafer is conveyed from the placing apparatus in procedures opposite to the semiconductor wafer transfer procedures as described above.

The holding apparatus can be applied to a wafer probing machine. In this probing machine, a distance of upward movement of table unit 20 must be determined so that wafer 50 can be moved to a probing position. The wafer probing machine has test head 70 to which wirings from a tester (not shown) are integrated. Test head 70 is located above the above-mentioned placing apparatus. Performance board 71 is connected to the lower surface of test head 70, and probe card 72, on the lower surface of which a large number of probes 73 are formed, is connected to board 71.

In the probing machine, semiconductor wafer 50 is chucked on table 21, as described above, and the holding apparatus is moved by an alignment apparatus (not shown) to a position where a large number of electrode pads formed on each chip of wafer 50 correspond to probes 73. Motor 31 is then driven to further move holding unit 20 upward, thereby bringing probes 73 into contact with electrode pads of each chip of wafer 50 to perform measurement. In this case, projecting member 40 is separated from ball screw 33.

As described above, according to the holding apparatus of this embodiment, the projecting member having the pins for receiving a wafer is not moved, and the table is moved to place a wafer thereon. Therefore, the wafer can be prevented from floating upon downward movement of the pins unlike in the conventional apparatus. Thus, the wafer can be stably held at a predetermined position. Therefore, the placing operation of the wafer can be very efficiently performed. Since the pins are not moved, the distal ends of the pins do not collide against the wafer upon their upward movement, thus generating very small noise.

Since the ball screw is not directly coupled to the table, a stroke of upward movement of the table can be increased. In addition, since the ball screw is not directly coupled to the table, a vibration of the table due to vibration of the motor can be eliminated, and displacement of the wafer on the table can be prevented.

In the above embodiment, the case has been described wherein the wafer is held. The present invention is not limited to the wafer. For example, the present invention can be applied to a low-profile member such as an LCDE substrate. The case has been exemplified wherein the holding apparatus is applied to the probing machine. However, the present invention is not limited to this but can be applied to various other apparatuses which receive and hold a plate-like member.

The present invention is not limited to a wafer probing machine, but may be applied to any other apparatuses which perform sheet-feed processing, such as an etching apparatus, a CVD apparatus, an ashing apparatus, and the like.

In the above embodiment, a wafer is transferred onto three pins. The number of pins can be three or more as long as a plate can be supported thereon. In the above embodiment, a wafer is simply held on the pins. A suction hole may be formed in the distal end of each pin to chuck a wafer.

What is claimed is:

1. A receiving method for receiving a plate-like member in a receiving apparatus having a vertically movable table member and at least three pins which project and retract upon vertical movement of said table member, comprising the steps of:

moving said table member downward to cause said pins to project from said table member;

placing said plate-like member on said pins; and moving said table member upward to conceal said pins under said table member, thereby receiving said plate-like member on said table member.

2. The method according to claim 1, wherein said plate-like member is conveyed immediately above said pins projected from said table member by a convey member supporting said plate-like member thereon, and then said convey member is moved sideways, thereby said plate-like member is placed on said pins.

* * * * *

UNITED STATES PATENT AND TRADEMARK OFFICE
CERTIFICATE OF CORRECTION

PATENT NO. : 5,065,495

DATED : November 19, 1991

INVENTOR(S) : Masaki Narushima et al.

It is certified that error appears in the above-identified patent and that said Letters Patent is hereby corrected as shown below:

On the Title page, item [30]

The Foreign Application Priority Data should be deleted.

Signed and Sealed this

Twenty-fifth Day of May, 1993

Attest:

MICHAEL K. KIRK

Attesting Officer

Acting Commissioner of Patents and Trademarks